United States Patent
Paton et al.

(10) Patent No.: US 6,797,614 B1
(45) Date of Patent: Sep. 28, 2004

(54) NICKEL ALLOY FOR SMOS PROCESS SILICIDATION

(75) Inventors: Eric N. Paton, Morgan Hill, CA (US); Paul R. Besser, Sunnyvale, CA (US); Minh V. Ngo, Fremont, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 10/440,847

(22) Filed: May 19, 2003

(51) Int. Cl.⁷ ............................................ H01L 21/44
(52) U.S. Cl. ..................... 438/655; 438/664; 438/682; 438/683
(58) Field of Search .................. 438/198, 285, 438/590, 602, 649, 651, 655, 656, 664, 682, 683, 762

(56) References Cited

U.S. PATENT DOCUMENTS

| | | | |
|---|---|---|---|
| 5,302,552 A | * 4/1994 | Duchateau et al. | ......... 438/664 |
| 6,124,190 A | * 9/2000 | Yamamoto et al. | ......... 438/592 |
| 6,268,295 B1 | * 7/2001 | Ohta et al. | ................... 438/735 |
| 6,300,203 B1 | 10/2001 | Buynoski et al. | |
| 6,342,414 B1 | 1/2002 | Xiang et al. | |
| 6,368,950 B1 | 4/2002 | Xiang et al. | |
| 6,432,805 B1 | 8/2002 | Paton et al. | |
| 6,458,679 B1 | 10/2002 | Paton et al. | |
| 6,465,309 B1 | 10/2002 | Xiang et al. | |
| 6,465,334 B1 | 10/2002 | Buynoski et al. | |
| 6,475,874 B2 | 11/2002 | Xiang et al. | |
| 6,492,216 B1 | * 12/2002 | Yeo et al. | ................... 438/197 |
| 6,503,833 B1 | * 1/2003 | Ajmera et al. | ............. 438/682 |
| 6,593,641 B1 | * 7/2003 | Fitzergald | ................... 257/616 |
| 6,605,513 B2 | * 8/2003 | Paton et al. | ................ 438/299 |

OTHER PUBLICATIONS

Veteran et al., Symposium B "Silicon Materials—Processing, Characterization, and Reliability" vol. 716 of the Materials Research Society Symposium Proceedings Series, Apr. 1–5, 2002, pp. 43–68.*

Law et al., Symposium C "Si–Front–End Junction Formation Technologies", vol. 717 of the Materials Research Society Symposium Proceedings Series, Apr. 2–4, 2002, pp. 78–90.

* cited by examiner

*Primary Examiner*—Kevin M. Picardat
(74) *Attorney, Agent, or Firm*—Foley & Lardner LLP

(57) ABSTRACT

A process of siliciding uses alloys to reduce the adverse affects of germanium on silicide regions. The alloy can include nickel and at least one of vanadium, tantalum, and tungsten. The process can utilize one or two annealing steps. The process allows better silicidation in SMOS devices. The silicided regions can be provided above a silicon/germanium substrate.

34 Claims, 4 Drawing Sheets

NICKEL ALLOY FOR SMOS PROCESS SILICIDATION

FIELD OF THE INVENTION

The present invention relates generally to integrated circuit (IC) fabrication. More particularly, the present invention relates to a design for and a method of improving silicidation of an IC substrate containing germanium.

BACKGROUND OF THE INVENTION

SMOS processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer. Germanium can also be implanted, deposited, or otherwise provided to silicon layers to change the lattice structure of the silicon and increase carrier mobility. Another way to increase transistor performance is by utilizing silicon germanium gates and/or by utilizing raised source and drain regions formed from silicon germanium.

The silicon germanium lattice associated with the germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another. Relaxed silicon has a conductive band that contains six equal valance bands. The application of tensile strength to the silicon causes four of the valance bands to increase in energy and two of the valance bands to decrease in, energy. As a result of quantum effects, electrons effectively weigh 30 percent less when passing through the lower energy bands. Thus, lower energy bands offer less resistance to electron flow.

In addition, electrons meet with less vibrational energy from the nucleus of the silicon atom, which causes them to scatter at a rate of 500 to 1,000 times less than in relaxed silicon. As a result, carrier mobility is dramatically increased in strained silicon compared to relaxed silicon, providing an increase in mobility of 80 percent or more for electrons and 20 percent or more for holes. The increase in mobility has been found to persist for current fields up to 1.5 megavolt/centimeter. These factors are believed to enable device speed increase of 35 percent without further reduction of device size, or a 25 percent reduction in power consumption without reduction in performance.

High levels of germanium at the surface of a wafer can adversely affect the formation of silicide layers. In particular, high concentration of germanium in a top surface of a substrate can adversely affect the formation of silicide layers above the source and drain regions. The germanium concentration at the top surface can be exacerbated by the processing associated with source and drain regions and gate structure formation.

The presence of germanium in a silicon layer can cause germanosilicides to form during the silicidation process. Germanosilicides negatively impact the formation of a silicide region because they have a higher resistance than pure nickel silicide, tungsten silicide, etc. According to one conventional silicidation process, a metal layer, such as a nickel, tungsten, or cobalt layer, is deposited above the silicon germanium substrate. The metal layer is annealed at elevated temperatures to form silicide regions (e.g., nickel silicide, cobalt silicide, tungsten silicide, etc.). In the example of nickel silicide, the nickel reacts with germanium and silicon at the elevated temperatures associated with annealing. The reaction forms pockets of nickel germanium, nickel silicide, and nickel germanium silicide (i.e., the phases are immiscible). The nickel germanium and nickel germanium silicide are referred as to germanosilicides and are undesirable because the resistance of germanosilicides is relatively high and because the agglomeration of separate phases occurs at a lower temperature than normal, resulting in a discontinuous film.

Mehmet C. Ozturk presented investigations of alloys of suicides at the Spring 2002 Materials Research Society (MRS) meeting. The investigations included results relating to platinum (Pt) and nickel (Ni) germanosilicide contacts with respect to heavily positively doped (P+) silicon germanium regions. In addition, zirconium (Zr) was also considered as a contact material. Zirconium contacts can provide a contact-resistivity near $10^{-8}$ ohm-centimeter$^2$.

Thus, there is a need for an efficient process for forming silicide wafers on a wafer surface in an SMOS process. Further, there is a need for a system and a method which reduces the effects of germanosilicide and/or agglomeration in silicide regions. Even further, there is a need for a method of siliciding a metal layer which avoids germanosilicides and immiscibility. Yet further, there is a need for a process which reduces the adverse effects of germanium on silicidation processes.

SUMMARY OF THE INVENTION

An exemplary embodiment relates to a method of manufacturing an integrated circuit. The method includes providing a gate structure above a semiconductor substrate that includes a strained material and siliciding the semiconductor substrate. The gate structure is provided between a first source location and a first drain location. The semiconductor substrate is silicided using an alloy that includes at least one of vanadium, tantalum, and tungsten. In certain embodiments, the siliciding step can be performed using a single step annealing process or a two step annealing process.

Another exemplary embodiment relates to a method of manufacturing an ultra-large scale integrated circuit including a transistor. The method includes steps of providing a metal layer on a top surface of a semiconductor substrate or layer and annealing to form at least one silicide region. The semiconductor substrate or layer includes strained silicon material, a silicon/germanium material, or a germanium material. The metal layer is an alloy including at least one of vanadium, tantalum, and tungsten.

Still another exemplary embodiment relates to a process performing a transistor. The process includes forming a gate structure on a substrate or layer and depositing a metal alloy including at least one of vanadium, tantalum and tungsten. The process also includes annealing to form silicide regions on the substrate or layer.

BRIEF DESCRIPTION OF THE DRAWINGS

Exemplary embodiments will hereafter be described with reference to the accompanying drawings, wherein like numerals denote like elements, and.

DETAILED DESCRIPTION OF PREFERRED AND EXEMPLARY EMBODIMENTS

FIGS. 1 through 8 illustrate methods of manufacturing an integrated circuit (IC) in accordance with an exemplary embodiment. The methods illustrated in FIGS. 1 and 2 reduce the formation of germanosilicides during silicidation. The methods utilize metal alloys to form silicide regions and can be used as a part of any process requiring silicidation. Advantageously, the metal alloys provide improved stability and suitable resistance for silicide regions on the IC substrate.

Referring to FIGS. 3 through 8, a cross-sectional view of a portion 12 of an integrated circuit (IC) is illustrated. Portion 12 (FIG. 3) is subjected to a process 100 (FIG. 1) to form an IC, Process 100 is described below with reference to FIGS. 1 and 3–7. In an alternative embodiment, portion 12 is subjected to a process 200 (FIG. 2) to form an IC. Process 200 is discussed after the discussion of FIG. 7 and is similar to process 100 except that it includes a two-step annealing process described with reference to FIGS. 6–8.

Figure 3:
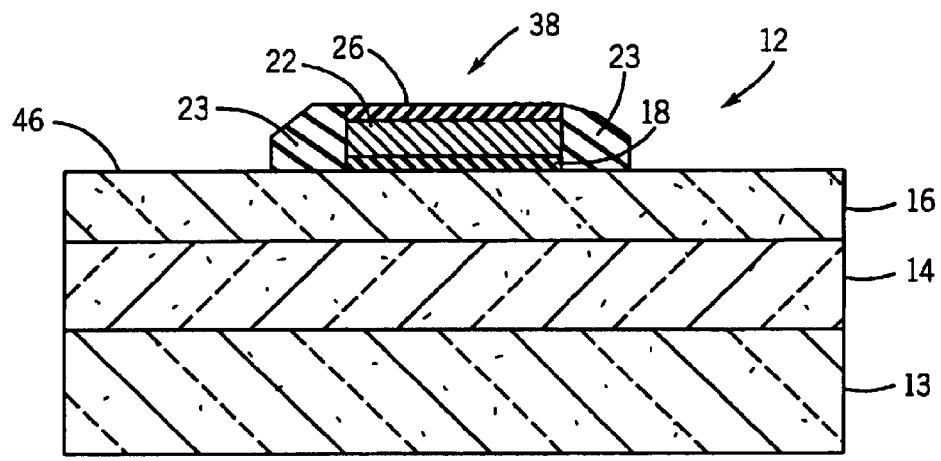
FIG. 3 is a cross-sectional view of the portion illustrated in FIG. 3, showing a gate structure formation step.

In FIG. 3, portion 12 includes a strained silicon layer 16 provided over a semiconductor substrate 14 or a germanium containing layer or substrate. Substrate 14 can be provided above a substrate 13.

Substrate 13 is optional and portion 12 can be provided with substrate 14 as the bottom-most layer. Substrate 13 can be the same material or a different material than substrate 14. In one embodiment, substrate 13 is a semiconductor substrate such as a silicon substrate upon which silicon germanium substrate 14 has been grown. In another embodiment, substrates 13 and 14 are not included and the substrate is comprised of layer 16. In such an embodiment, layer 16 can be a silicon germanium substrate or a strained silicon substrate.

Portion 12 can be any type of semiconductor device, or portion thereof, made from any of the various semiconductor processes such as a complementary metal oxide semiconductor (CMOS) process, a bipolar process, or another semiconductor process. Portion 12 may be an entire IC or a portion of an IC including a multitude of electronic component portions.

Substrate 14 is preferably silicon germanium or another semiconductor material including germanium, and can be doped with P-type dopants or N-type dopants. Substrate 14 can be an epitaxial layer provided on a semiconductor or an insulative base, such as substrate 13. Furthermore, substrate 14 is preferably a composition of silicon germanium ($Si_{1-x}Ge_x$, where X is approximately 0.2 and is more generally in the range of 0.1–0.4). Substrate 14 can be grown or deposited.

In one embodiment, substrate 14 is grown above substrate 13 by chemical vapor deposition (CVD) using disilane ($Si_2H_6$) and germane ($GeH_4$) as source gases with a substrate temperature of 650° C., a disilane partial pressure of approximately 30 mPa and a germane partial pressure of approximately 60 mPa. Growth of silicon germanium material may be initiated using these ratios, or, alternatively, the partial pressure of germanium may be gradually increased beginni from a lower pressure or zero pressure to form a gradient composition. Alternatively, a silicon layer can be doped by ion implantation with germanium, or other processes can be utilized to form substrate 14. Preferably, substrate 14 is grown by epitaxy to a thickness of less than approximately 5000 Å (and preferably between approximately 1500 Å and 4000 Å).

A strained silicon layer 16 is formed above substrate 14 by an epitaxial process. Preferably, layer 16 is grown by CVD using disilane ($Si_2H_6$) as a source gas at a temperature between approximately 600 and 800° C. (e.g., approximately 650° C.). Layer 16 can be a pure silicon layer and have a thickness of between approximately 50 and 500 Å, and preferably approximately 200 Å.

The substrate for portion 12 can be a semiconductor substrate such as silicon, gallium arsenide, germanium, or another substrate material. The substrate can include one or more layers of material and/or features such as lines, interconnects, vias, doped portions, etc., and can further include devices such as transistors, microactuators, microsensors, capacitors, resistors, diodes, etc. The substrate can be an entire IC wafer or part of an IC wafer. The substrate can be part of an integrated circuit such as a memory, a processing unit, an input/output device, etc.

In process 100 (FIG. 1) at step 52, one or more gate structures 38 are formed above substrate 14. In FIG. 3, gate structure 38 is formed by providing a gate stack including a gate dielectric layer 18 above a top surface 46 of layer 16, a gate conductor 22, and a bottom anti-reflective (BARC) layer 26. Top surface 46 can be considered a top surface of the substrate or wafer associated with portion 12, even though surface 46 corresponds to the top surface of layer 16 (FIG. 3).

Gate dielectric layer 18 can be a 5–30 Å thick layer of thermally grown silicon dioxide. Alternatively, layer 18 can be deposited. Alternative materials for layer 18 include high-k dielectric layers, medium-k dielectric layers, silicon nitride, and other insulative materials.

Gate conductor 22 is preferably a polysilicon layer having a thickness of 1000–2000 Å. Gate conductor 22 can be deposited as a P-doped o r N-doped layer. Alternatively, conductor 22 can be a metal layer such as a refractory metal layer deposited by chemical vapor deposition (CVD) or sputtering. In one embodiment, conductor 22 is doped with germanium to adjust its work function. Process 100 advantageously reduces the pressure of germanosilicides in conductor 22 when a germanium/polysilicon gate conductor is utilized.

Layer 26 is preferably an anti-reflective coating material such as silicon oxynitride (SiON) or silicon nitride ($Si_3N_4$). Alternative materials for layer 26 can also be utilized. Layer 26 serves a dual purpose of providing anti-reflective properties (e.g. as a BARC layer) as well a s protecting gate conductor 22 during etching steps.

In FIG. 3, layers 26 and 18 and gate conductor 22 are etched in a conventional process to leave gate structure 38 (step 52 of process 100). Gate structure 38 can include spacers 23 formed in a deposition and etch back process. In one embodiment, spacers 23 are silicon dioxide or silicon nitride. Substrate 14 and layer 16 can be doped to provide appropriate regions such as halo regions, channel regions, and source a nd drain regions in step 52.

Figure 4:
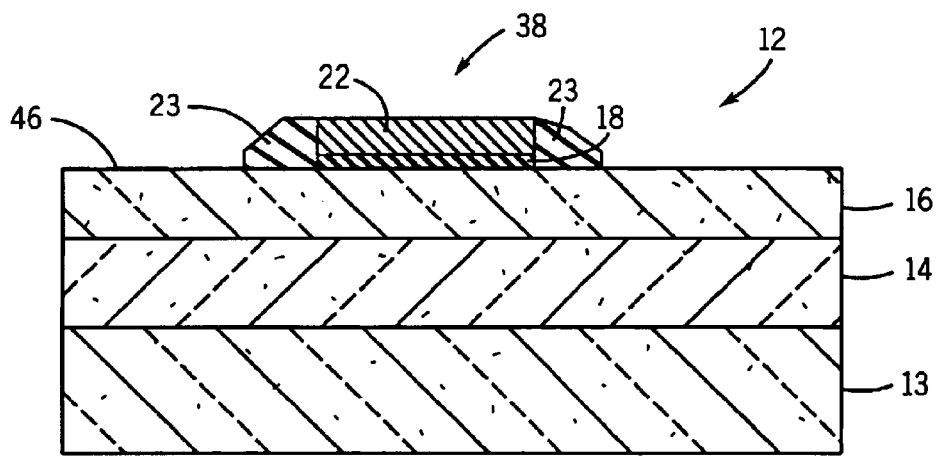
FIG. 4 is a cross-sectional view of the portion illustrated in FIG. 3, showing a metal layer deposition step.

In FIG. 4, bottom anti-reflective coating (BARC) layer 26 can be removed from gate conductor 22. BARC layer 26 is preferably removed for appropriate silicidation of gate conductor 22. In on e embodiment, portions of spacers 23 are also removed so that a top surface of spacer 23 is planar with a top surface of gate conductor 22.

Figure 5:
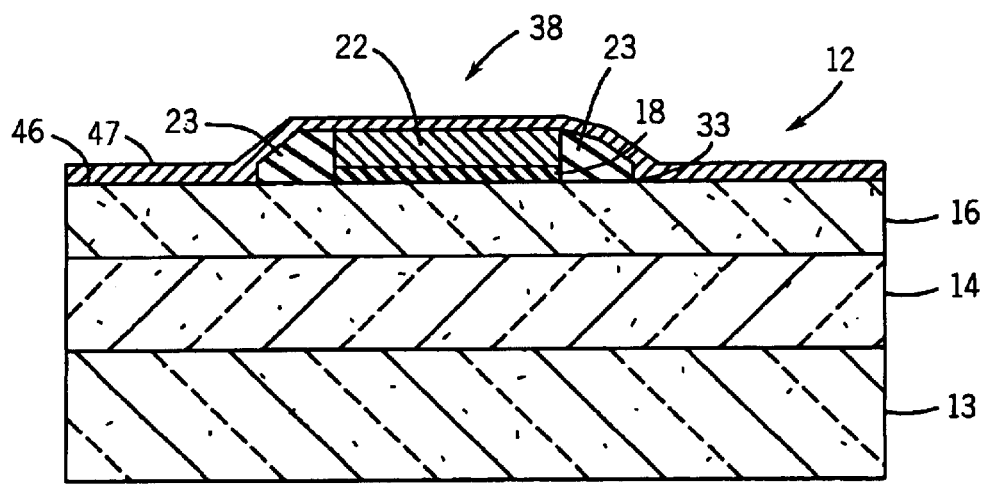
FIG. 5 is a cross-sectional view of the portion illustrated in FIG. 4, showing a coating removal step.

In FIG. 5, a metal layer 47 is deposited above top surface 46 of layer 16 and gate structure 38 in a step 54 of process 100. Preferably, layer 47 is deposited in a sputter deposition or chemical vapor deposition (CVD) process to provide a source of metal material for silicidation. Layer 47 has a thickness of between approximately 50 and 300 Å, and is preferably approximately 100 Å.

In one embodiment, layer 47 can be deposited utilizing an alloy sputter deposition target as a single layer. Layer 47 is preferably deposited at a lower temperature to avoid formations of germanosilicides. Layer 47 can be deposited at temperatures less than 500° C. Preferably, layer 47 is an alloy of nickel and at least one of vanadium (V), tantalum, (Ta) or tungsten (W). The atomic percentage of nickel is at least 70 percent. The atomic percentage of one of vanadium, tantalum and tungsten can be from 1–30 percent. Alternatively, the alloy can include a metal other than nickel.

In another alternative embodiment, the alloy can be ternary alloy. The ternary alloy can include two or more species, such as vanadium, tantalum and tungsten, and may be comprised of at least 70 atomic percent nickel.

Plasma vapor deposition (PVD) utilizing an alloy target can be utilized in a PVD sputtering system to form layer 47. In one embodiment, a standard Endura 5500 machine manufactured by Applied Materials, Inc. deposits the nickel alloy using a target that is 1 percent vanadium, tantalum or tungsten, with the remaining atomic percent being nickel.

In an alternative embodiment, layer 47 can be a bi-layer comprised of a nickel layer and a layer of another material (e.g., an alloying metal or material), such as vanadium, tantalum, chromium, molybdenum, niobium, or tungsten. The alloying metal may be deposited above the nickel layer, or the nickel layer may be deposited above the alloying metal. The thickness of the nickel and alloying metal layers may vary depending on the alloy composition desired. For example, to obtain a nickel alloy having 20% alloy metal, nickel may be deposited to a thickness of approximately 80 Å followed by deposition of a alloy metal layer having a thickness of approximately 20 Å. Any of a variety of thicknesses may be used for forming the bi-layer, and the bi-layers can be deposited by PVD sputtering or CVD techniques. The layers are combined in an annealing step 56 described below or in a separate annealing step. Annealing to combine the bi-layers can be a rapid thermal anneal at a temperature between approximately 400 and 700° C. (e.g., 500° C.).

Figure 6:
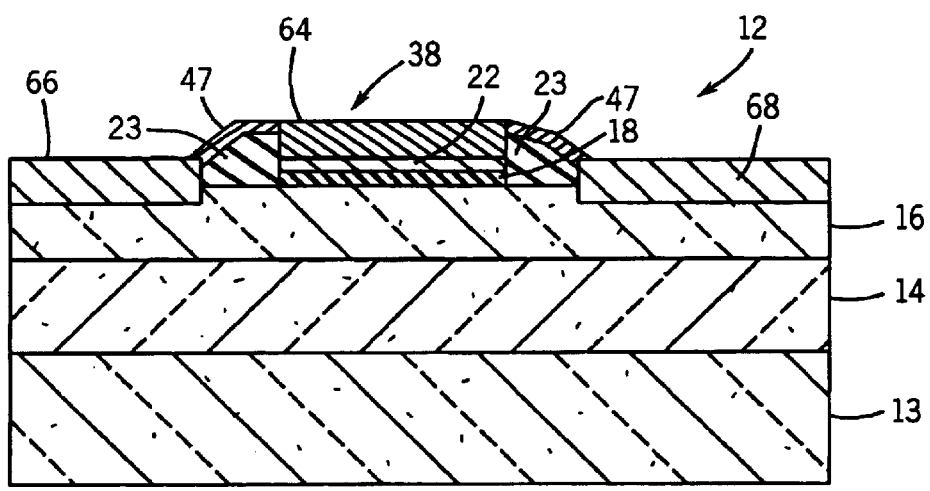
FIG. 6 is a cross-sectional view of the portion illustrated in FIG. 5, showing an annealing step.

In FIG. 6, portion 12 is annealed in accordance with a step 56 of process 100 to form silicide regions 64, 66 and 68. Regions 66 and 68 are above and within source and drain regions. Region 64 is above and within gate conductor 22.

Regions 64, 66, and 68 preferably consume a portion of the layer over which they are provided. Layer 47 remains above spacers 23 and does not react with the spacer material. Preferably, the annealing step is performed as a rapid thermal anneal (RTA) at a temperature 400–600° C. in a nitrogen ambient.

Silicide regions 64, 66, and 68 are preferably mononickel silicide. The low temperature associated with the annealing process and deposition process of layer 47 reduces the formation of germanosilicides.

Figure 7:
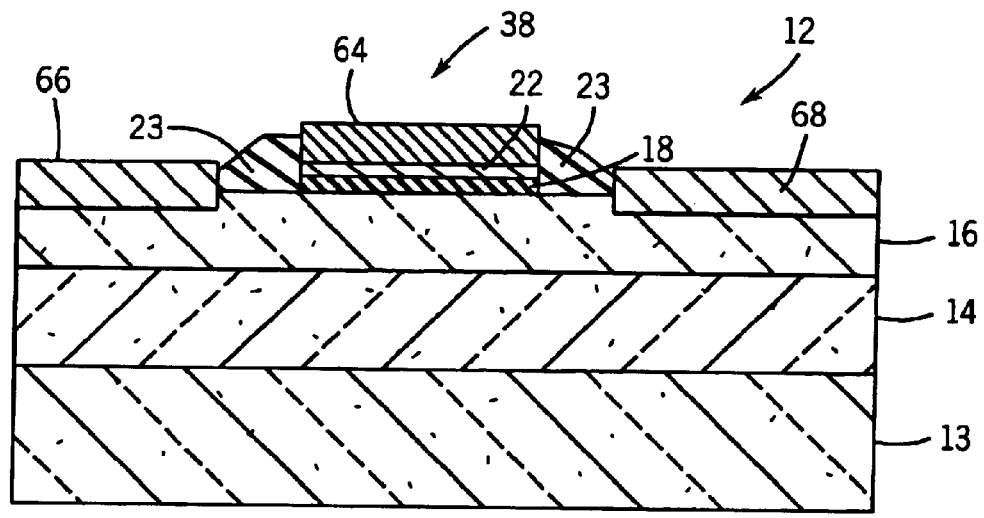
FIG. 7 is a cross-sectional view of the portion illustrated in FIG. 6, showing a stripping step.

Although shown on layer 16 in FIG. 7, regions 64, 66, and 68 can be formed on a substrate or layer above the substrate. Regions 64, 66, and 68 can be formed on strained semiconductor layers, silicon/germanium substrates or layers, germanium substrates or layers, etc.

After regions 64, 66 and 68 are formed, the remaining portions of layer 47 is etched or stripped. Stripping preferably utilizes a sulfuric peroxide mixture (SPM) (e.g., $H_2SO_4$, $H_2O_2$ and water) or an ammonium peroxide mixture (APM) (e.g., $NH_4OH$, $H_2O_2$ and water) which removes layer 47 from above spacers 23.

Figure 1:
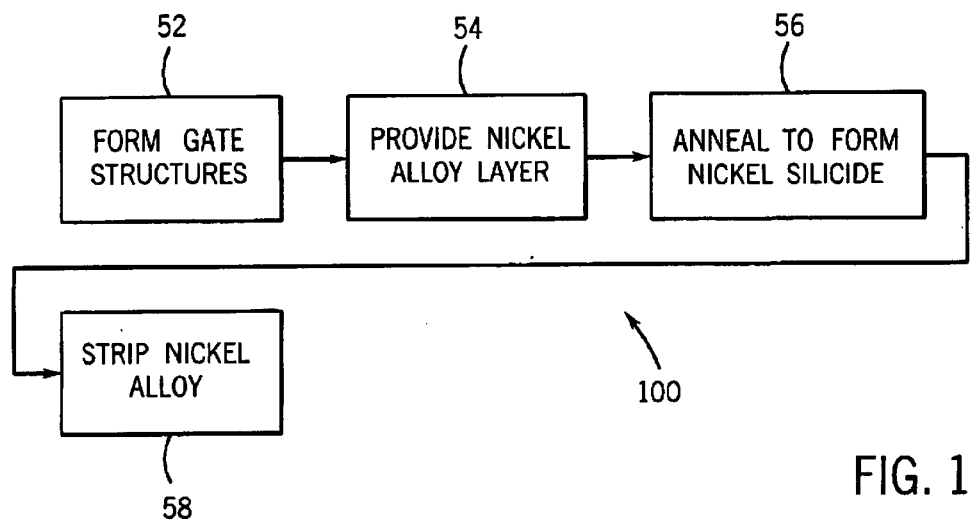
FIG. 1 is a flow diagram showing a fabrication process for a siliciding germanium-containing IC substrate in accordance with an exemplary embodiment.
Figure 2:
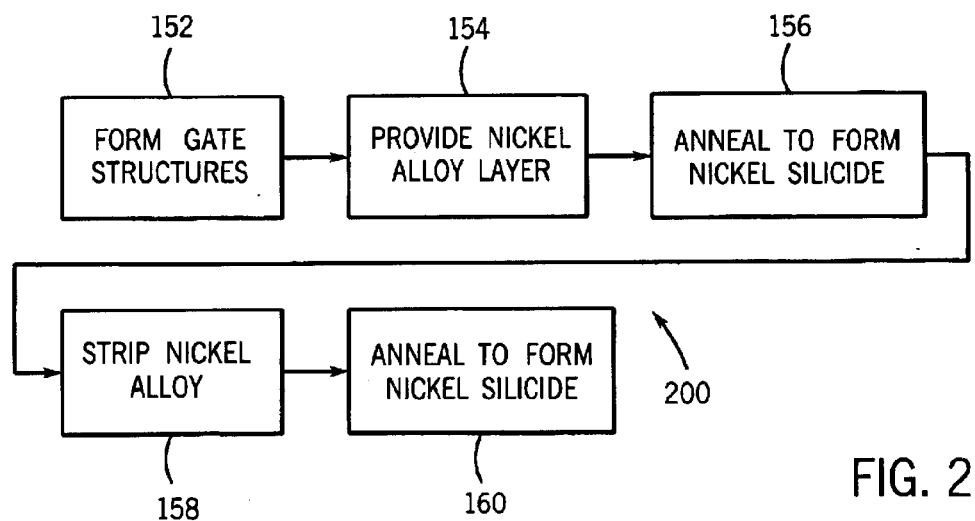
FIG. 2 is another flow diagram showing a fabrication process for siliciding a germanium-containing IC substrate in accordance with another exemplary embodiment.

With reference to FIG. 2, process 200 includes steps substantially similar to process 100. Gate structures are formed in a step 152, similar to step 52, and a nickel alloy layer is provided in a step 154 similar to step 54. The nickel alloy layer (e.g., layer 47 in FIG. 5) can be provided by a variety of techniques including PVD sputter deposition from an alloy target or a bi-layer deposition process.

In step 156, portion 12 is annealed to form regions 64, 66 and 68. The anneal is preferably an RTA at 320–400° C. in a nitrogen ambient to form a dinickel silicide ($Ni_2Si$). The nickel alloy which is not silicided is stripped in a step 158 similar to step 58 (FIG. 7).

Figure 8:
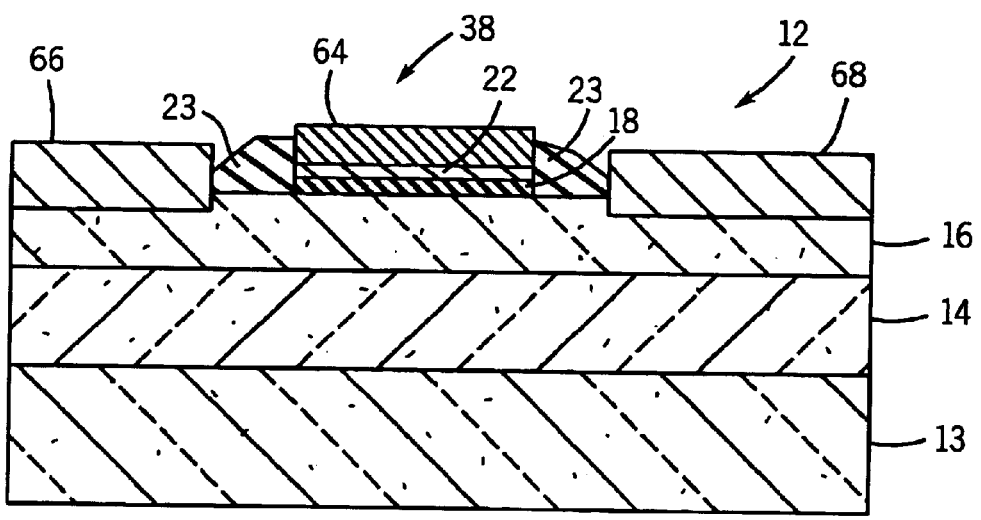
FIG. 8 is a cross-sectional view of the portion illustrated in FIG. 7, showing another annealing step.

In a step 160, portion 12 is annealed again. Preferably, annealing in step 160 changes dinickel suicide ($Ni_2Si$) in regions 64, 66 and 68 into mononickel silicide (NiSi). Regions 64, 66, and 68 can grow in the second annealing step as shown in FIG. 8. Step 160 can be performed at a temperature of 400–600° C. in a nitrogen ambient. After step 160, unreacted nickel alloy can be stripped again in a step similar to step 158.

Process 200 advantageously is less likely to cause shorts across spacer 23 (FIG. 7). Nickel from layer 47 can diffuse into spacer 23 when the thermal budget of the RTA process is large. Alternatively, large RTA steps can cause silicon to diffuse from the substrate and create shorts from source to drain.

Silicidation can be further improved by implanting portion 12 with silicon before providing layer 47. In one embodiment, extra silicon is added by ion implantation utilizing equipment manufactured by Applied Materials, Inc. or a variant, at an energy level of 20–30 keV and a dose of $5 \times 10^{14} - 5 \times 10^{15}$ dopants per centimeter squared. A target depth for the silicon can be 20–400 Å deep. In such an embodiment, a conventional silicidation process, such as, a nickel silicidation process or cobalt silicidation process can be utilized rather than process 100 or process 200.

In another exemplary embodiment, portion 12 can be implanted with chlorine to provide superior silicidation. In such an embodiment, a chlorine implant is provided via ion implant equipment and annealed at a temperature of 700–800° C. before layer 47 is provided. Preferably, the chlorine is implanted at an energy level of 20–30 keV at a dose of $5 \times 10^{14} - 5 \times 10^{15}$ dopants per centimeter squared. The chlorine preferably reacts with germanium, volatizes it, and depletes it from layer 16. According to one alternative, a conventional silicidation process can be utilized following chlorine implantation. The conventional silicidation process can utilize nickel or cobalt suicides.

It is understood that although the detailed drawings, specific examples, and particular values given provide exemplary embodiments of the present invention, the exemplary embodiments are for the purpose of illustration only. The method and apparatus in the aforementioned embodiments are not limited to the precise details and descriptions disclosed. For example, although particular deposition techniques are described,.other types of deposition processes can also be utilized. Various changes may be made to the details disclosed without departing from the scope of the invention which is defined by the following claims.

What is claimed is:

1. A method of manufacturing an integrated circuit, the method comprising:

providing a gate structure between a source location and a drain location above a semiconductor substrate, the semiconductor substrate including a strained material; and siliciding the semiconductor substrate using an alloy including nickel and at least one of chromium, molybdenum, niobium, vanadium, tantalum, and tungsten.

2. The method of claim 1, wherein the step of siliciding the semiconductor substrate comprises a two-step annealing process.

3. The method of claim 2, further comprising:

siliciding semiconductor material above the gate structure using an alloy including at least one of chromium, molybdenum, niobium, vanadium, tantalum, and tungsten.

4. The method of claim 2, wherein a first annealing step forms a dinickel silicide and a second annealing step forms mononickel silicide.

5. The method of claim 1, wherein the step of siliciding the semiconductor substrate comprises depositing a layer of material, the layer of material comprising at least one of nickel, cobalt, and tungsten.

6. The method of claim 5, wherein the step of siliciding the semiconductor substrate includes a first annealing at 320–400° C. and a second annealing at 400–600° C.

7. The method of claim 1, wherein the step of siliciding the semiconductor substrate uses a sputter deposition with an alloy target including at least one of chromium, molybdenum, niobium, vanadium, tantalum and tungsten.

8. The method of claim 6, wherein the step of siliciding the semiconductor substrate utilizes a ternary nickel alloy.

9. The method of claim 1, wherein the step of siliciding the semiconductor substrate utilizes a single annealing step at 400–600° C.

10. The method of claim 1, wherein the strained material is above a silicon germanium layer.

11. A method of manufacturing an ultra-large scale integrated circuit including a transistor, the method comprising steps of:

providing a metal layer on a top surface of a semiconductor substrate or layer, the semiconductor substrate or layer including at least one of a strained silicon material, a silicon/germanium material, and a germanium material; and annealing portions of the metal layer to form at least one silicide region, the metal layer being an alloy including nickel and at least one of chromium, molybdenum, niobium, vanadium, tantalum, and tungsten.

12. The method of claim 11, wherein the metal layer includes nickel and tantalum.

13. The method of claim 11, wherein the metal layer includes nickel and vanadium.

14. The method of claim 11, wherein the metal layer includes nickel and tungsten.

15. The method of claim 14, wherein the annealing is a two-part annealing process.

16. The method of claim 11, further comprising stripping unreacted metal after the annealing step.

17. A process of forming a transistor, the process comprising:

forming a gate structure on a substrate or layer including at least one of a strained material and a material comprising germanium;

depositing a alloy nickel including at least one of chromium, molybdenum, niobium, vanadium, tantalum, and tungsten; and annealing to form silicide regions on the substrate or layer.

18. The process of claim 17, wherein the substrate or layer is a semiconductor material that includes silicon.

19. The process of claim 18, further comprising:

forming a BARC layer above the gate structure;

removing the BARC layer; and siliciding the gate structure using the nickel alloy.

20. The process of claim 18, wherein the nickel alloy includes chromium.

21. The method of claim 1, wherein the alloy for siliciding the semiconductor substrate comprises nickel and chromium.

22. The method of claim 1, wherein the alloy for siliciding the semiconductor substrate comprises at least 70 atomic percent nickel.

23. The method of claim 22, wherein the alloy for siliciding the semiconductor substrate is a ternary alloy.

24. The method of claim 1, further comprising implanting chlorine in the semiconductor substrate prior to the step of siliciding the semiconductor substrate.

25. The method of claim 1, further comprising implanting silicon in the semiconductor substrate prior to the step of siliciding the semiconductor substrate.

26. The method of claim 11, wherein the metal layer is an alloy including nickel and chromium.

27. The method of claim 11, wherein the metal layer comprises greater than 70 atomic percent nickel.

28. The method of claim 27, wherein the metal layer is a ternary alloy.

29. The method of claim 11, further comprising providing a chlorine implant to the semiconductor substrate or layer prior to the step of providing a metal layer on the top surface of the semiconductor substrate or layer.

30. The method of claim 11, further comprising providing a silicon implant to the semiconductor substrate or layer prior to the step of providing a metal layer on the top surface of the semiconductor substrate or layer.

31. The process of claim 17, wherein the nickel alloy comprises at least 70 atomic percent nickel.

32. The method of claim 31, wherein the nickel alloy is a ternary alloy comprising nickel and two other elements selected from chromium, molybdenum, niobium, vanadium, tantalum, and tungsten.

33. The method of claim 17, further comprising implanting the substrate or layer with chlorine before the step of depositing a nickel alloy.

34. The method of claim 17, further comprising implanting the substrate or layer with silicon before the step of depositing a nickel alloy.

* * * * *

UNITED STATES PATENT AND TRADEMARK OFFICE
CERTIFICATE OF CORRECTION

PATENT NO. : 6,797,614 B1 Page 1 of 1
DATED : September 28, 2004
INVENTOR(S) : Eric N. Paton et al.

It is certified that error appears in the above-identified patent and that said Letters Patent is hereby corrected as shown below:

Column 8,
Line 10, preceding "including" delete "alloy nickel" and substitute -- nickel alloy --.

Signed and Sealed this

Fifteenth Day of February, 2005

JON W. DUDAS
*Director of the United States Patent and Trademark Office*